(12) United States Patent
Uchida et al.

(10) Patent No.: US 9,696,096 B2
(45) Date of Patent: Jul. 4, 2017

(54) LOOP HEAT PIPE AND ELECTRONIC EQUIPMENT USING THE SAME

(71) Applicant: FUJITSU LIMITED, Kawasaki-shi, Kanagawa (JP)

(72) Inventors: Hiroki Uchida, Isehara (JP); Susumu Ogata, Isehara (JP); Seiji Hibino, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 184 days.

(21) Appl. No.: 13/870,569

(22) Filed: Apr. 25, 2013

(65) Prior Publication Data

US 2013/0233521 A1    Sep. 12, 2013

Related U.S. Application Data

(63) Continuation of application No. PCT/JP2010/069454, filed on Nov. 1, 2010.

(51) Int. Cl.
 F28D 15/02    (2006.01)
 F28D 15/04    (2006.01)
 (Continued)

(52) U.S. Cl.
 CPC ..... *F28D 15/0266* (2013.01); *F28D 15/0275* (2013.01); *F28D 15/043* (2013.01);
 (Continued)

(58) Field of Classification Search
 CPC ...... F28F 13/12; F28D 15/00; F28D 15/0266; F28D 15/04
 (Continued)

(56) References Cited

U.S. PATENT DOCUMENTS 4,061,131 A * 12/1977 Bohanon ............... F24J 2/4649
 126/590
4,515,209 A *  5/1985 Maidanik ............. F28D 15/043
 165/104.22
(Continued)

FOREIGN PATENT DOCUMENTS

JP    60-191147    9/1985
JP    2001-165584    6/2001
(Continued)

OTHER PUBLICATIONS

International Search Report, mailed in connection with PCT/JP2010/069454 and mailed Feb. 8, 2011.
(Continued)

*Primary Examiner* — Len Tran
*Assistant Examiner* — Gustavo Hincapie Serna
(74) *Attorney, Agent, or Firm* — Fujitsu Patent Center

(57) ABSTRACT

A loop heat pipe includes an evaporator to cause a liquid-phase working fluid to be vaporized by heat from a heat source; a condenser to condense the vaporized working fluid; a circulation path including a liquid line and a vapor line to connect the condenser and the evaporator in a loop; a tank provided on the liquid line and configured to accommodate the liquid-phase working fluid; a connecting line to connect the tank and the evaporator to supply the liquid-phase working fluid to the evaporator; and a bypass line positioned over the connecting line in a direction of gravity and connecting the evaporator and the tank, the bypass line being configured to discharge a vapor bubble produced in the evaporator during operation of the loop heat pipe to the tank.

14 Claims, 15 Drawing Sheets

(51) Int. Cl.
*H01L 23/427* (2006.01)
*F28D 21/00* (2006.01)

(52) U.S. Cl.
CPC .... *H01L 23/427* (2013.01); *F28D 2021/0028* (2013.01); *H01L 2924/0002* (2013.01)

(58) Field of Classification Search
USPC ............ 165/104.22, 104.26, 104.27, 104.32, 165/104.33; 361/700
See application file for complete search history.

(56) References Cited

U.S. PATENT DOCUMENTS

| | | | | |
|---|---|---|---|---|
| 4,745,906 | A * | 5/1988 | DeBeni | F24J 2/44 126/584 |
| 5,259,447 | A * | 11/1993 | Ogushi | B64G 1/50 165/104.22 |
| 5,529,447 | A * | 6/1996 | Bruns | B60P 3/066 410/156 |
| 5,535,818 | A * | 7/1996 | Fujisaki et al. | 165/104.33 |
| 5,944,092 | A * | 8/1999 | Van Oost | 165/104.26 |
| 6,381,135 | B1 * | 4/2002 | Prasher | F28D 15/043 165/104.26 |
| 6,382,309 | B1 * | 5/2002 | Kroliczek et al. | 165/104.26 |
| 6,397,936 | B1 * | 6/2002 | Crowley et al. | 165/104.26 |
| 6,533,029 | B1 * | 3/2003 | Phillips | F28D 15/043 165/104.26 |
| 6,810,946 | B2 * | 11/2004 | Hoang | 165/104.26 |
| 6,840,304 | B1 * | 1/2005 | Kobayashi | B01D 3/007 165/104.25 |
| 6,948,556 | B1 * | 9/2005 | Anderson | F28D 15/0266 165/104.26 |
| 6,990,816 | B1 * | 1/2006 | Zuo | B64G 1/50 62/3.7 |
| 7,190,582 | B2 * | 3/2007 | Tonosaki et al. | 361/700 |
| 7,431,071 | B2 * | 10/2008 | Wenger | 165/47 |
| 7,661,464 | B2 * | 2/2010 | Khrustalev | F28D 15/043 165/104.21 |
| 7,748,436 | B1 * | 7/2010 | Anderson | F28D 15/0266 165/104.21 |
| 8,047,268 | B1 * | 11/2011 | Kroliczek et al. | 165/104.26 |
| 2004/0182550 | A1 * | 9/2004 | Kroliczek et al. | 165/104.26 |
| 2007/0062675 | A1 * | 3/2007 | Chen | H01L 23/473 165/104.27 |
| 2007/0163756 | A1 * | 7/2007 | Wang | H05K 7/20336 165/104.26 |
| 2007/0175614 | A1 * | 8/2007 | Li | F28D 15/0266 165/104.26 |
| 2008/0078530 | A1 * | 4/2008 | Chang et al. | 165/104.26 |
| 2008/0283223 | A1 * | 11/2008 | Chang et al. | 165/104.26 |
| 2009/0090195 | A1 * | 4/2009 | Matter et al. | 73/861.52 |
| 2010/0259888 | A1 * | 10/2010 | Pomytkin et al. | 361/679.47 |
| 2010/0300656 | A1 * | 12/2010 | Lu | F28D 15/0266 165/104.26 |

FOREIGN PATENT DOCUMENTS

| | | |
|---|---|---|
| JP | 2002-340489 | 11/2002 |
| JP | 2004-218887 | 8/2004 |
| JP | 2005-86078 A | 3/2005 |
| JP | 2005-147625 | 6/2005 |
| JP | 2006-12874 A | 1/2006 |
| JP | 2009-115396 | 5/2009 |

OTHER PUBLICATIONS

Japanese Office Action mailed Sep. 24, 2013 for corresponding Japanese Application No. 2012-541648, with Partial English-language Translation.

* cited by examiner

LOOP HEAT PIPE AND ELECTRONIC EQUIPMENT USING THE SAME

CROSS-REFERENCE TO RELATED APPLICATIONS

This application is a continuation application filed under 35 U.S.C. 111(a) claiming benefit under 35 U.S.C. 120 and 365(c) of PCT International Application No. PCT/JP2010/069454 filed on Nov. 1, 2010 and designating the United States, the entire contents of which are incorporated herein by references.

FIELD

The present disclosures relate to a loop heat pipe and electronic equipment using the same.

BACKGROUND

A loop heat pipe illustrated in FIG. 1A is known as a device for cooling a heat source (see, for example, Patent Documents 1 and 2 listed below). The loop heat pipe is a cooling system in which an evaporator 110 and a condenser 130 are connected in a loop via a liquid line 112 and a vapor line 113 to circulate a working fluid. As illustrated in FIG. 1B, the evaporator 110 is brought into contact with a heat source such as a CPU or the like to vaporize the working liquid 105 in the evaporator 110 making use of heat absorbed from the heat source 120. On this principle, the heat source 120 is cooled. The vapor 103 generated in the evaporator 110 is fed through the vapor line 113 to a condenser 130, at which the vapor 103 is liquefied. The liquid-state working fluid is stored in a reservoir tank 125 and supplied back to the evaporator 110.

Since the heat source 120 such as an electronic component exemplified by an LSI package is typically shaped in a flat plate, it is preferable for the evaporator 110 which serves as a heat absorber to be shaped in a flat plate so as to be brought into close contact with the heat source 120. To improve the cooling ability of the loop heat pipe, increasing the internal volume of the evaporator 110 is effective. However, there is demand for the evaporator 110 to be made as compact as possible in view of the technical trend of reduction in the size and the weight of electronic equipment. To satisfy the contradicting requirements, a flat plate evaporator is desirable because it has a compact external shape and a large internal volume.

A wick 115 made of a porous material is provided inside the evaporator case 111 so as to be in close thermal contact with the inner wall of the evaporator case 111. The working liquid 105 is driven by a capillary force of the wick 115. To efficiently vaporize the working liquid 105 penetrating through the wick 115, it has been proposed to arrange multiple wicks 115 in parallel with each other inside the evaporator case 111. This arrangement can increase the contact area between the wicks 115 and the evaporator case 111 (see, for example, Patent Document 3 listed below).

However, if heat is transferred too quickly from the heat source 120 to the working liquid 105 flowing into the evaporator 110, the working liquid 105 comes to a boil before it reaches the wick 115. As a result, bubbles 101 are generated as illustrated in a circle of FIG. 1B. Particularly, for a thin and compact flat plate evaporator, bubbles 101 are easily generated because the heat source 120 is positioned very close to the working liquid 105. The bubbles 101 prevent the working liquid from flowing into the evaporator 110, and they impede the capillary force of the wick 115, as illustrated in FIG. 1C. Without the vapor bubbles 101 in the working liquid 105, the capillary force acts toward the vapor side in the porous wick 115 (as indicated by the arrow 116) and the working liquid 105 is appropriately transported to the vapor side. In contrast, if the bubbles 101 are generated in the working liquid 105, surface tensions on the vapor side and the liquid side of the wick 115 counteract each other as indicated by the upward arrows and the downward arrows, and a sufficient capillary force is not exerted. This causes circulation of the working liquid 105 to be attenuated or prevented, and the cooling performance of the loop heat pipe is ultimately degraded.

LIST OF PRIOR ART DOCUMENTS

PATENT DOCUMENT 1: Japanese Laid-open Patent Publication No. 2004-218887
PATENT DOCUMENT 2: Japanese Laid-open Patent Publication No. 2005-147625
PATENT DOCUMENT 3: Japanese Laid-open Patent Publication No. 2009-115396

SUMMARY

According to an aspect of the embodiments, a loop heat pipe includes:
an evaporator to cause a liquid-phase working fluid to be vaporized by heat from a heat source;
a condenser to condense the vaporized working fluid;
a circulation path including a liquid line and a vapor line to connect the condenser and the evaporator in a loop;
a tank provided on the liquid line and configured to accommodate the liquid-phase working fluid;
a connecting line to connect the tank and the evaporator to supply the liquid-phase working fluid to the evaporator; and
a bypass line positioned over the connecting line in a direction of gravity and connecting the evaporator and the tank, the bypass line being configured to discharge a vapor bubble produced in the evaporator during operation of the loop heat pipe to the tank.

The object and advantages of the invention will be realized and attained by means of the elements and combinations particularly pointed out in the claims.

It is to be understood that both the foregoing general description and the following detailed description are exemplary and explanatory and are not restrictive to the invention as claimed.

DESCRIPTION OF EMBODIMENTS

In general, a flat plate evaporator has a narrow inlet and vapor bubbles are apt to accumulate inside the evaporator, as compared with a cylindrical evaporator. The inventors of the present application found that the problems of vapor bubbles due to heat leakage become more pronounced when the flat plate evaporator is arranged in the vertical orientation or applied to a multiprocessor system.

Accordingly, it is desired that vapor bubbles due to heat leakage are removed quickly from a working fluid flowing into an evaporator of a loop heat pipe to prevent bubble clogging in order to introduce the working fluid into the evaporator efficiently.

<Embodiment 1>

Figure 2A:
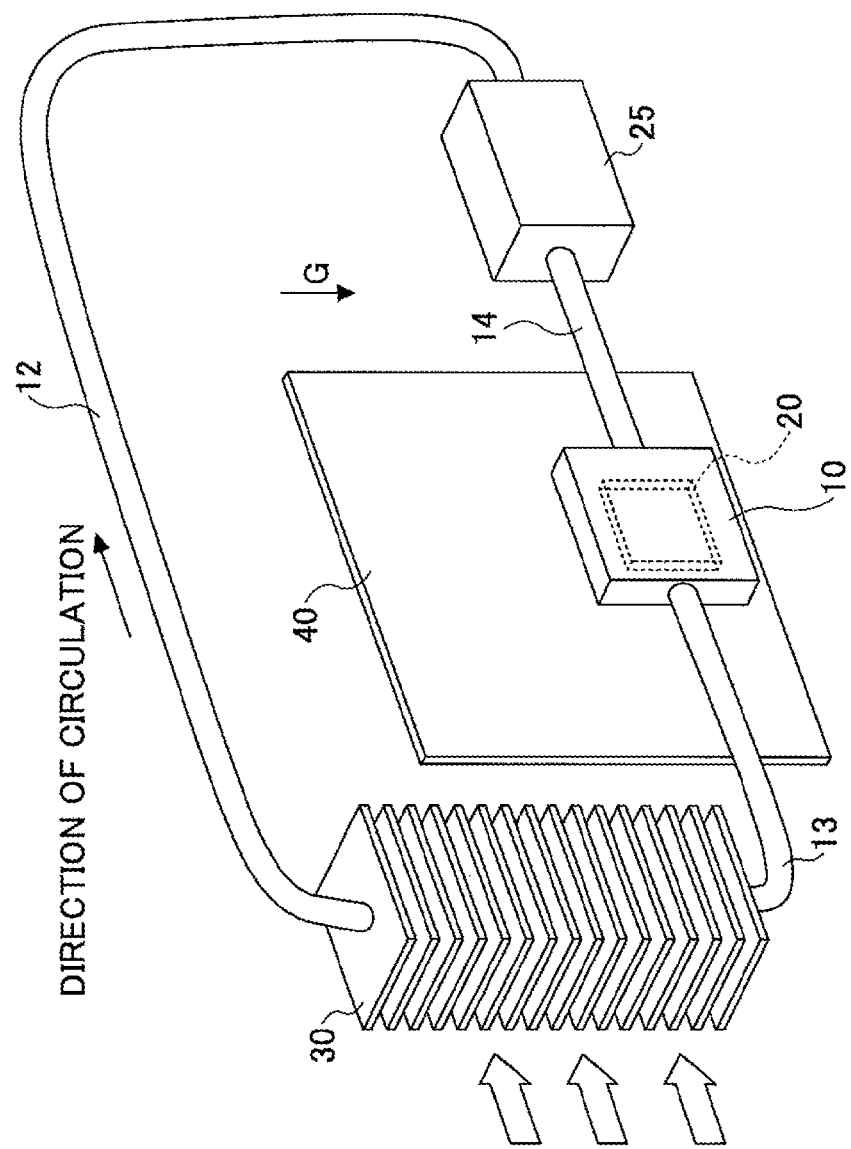
FIG. 2A illustrates a structure of a vertically arranged loop heat pipe.

In Embodiment 1, explanation is made of a basic structure of a loop heat pipe for cooling a single heat source, in which a single evaporator is inserted in a circulating path of the loop heat pipe. The loop heat pipe of Embodiment 1 is applicable to a vertical configuration. FIG. 2A illustrates a structure in which a typical loop heat pipe is simply arranged in a vertical orientation. In a blade server or a personal computer with a vertically oriented hard disk drive, a printed circuit board 40 is generally arranged in the vertical orientation (parallel to the direction of gravity G) in a housing rack. In this case, a flat plate evaporator 10 is also arranged in the vertical orientation to cool a CPU (a heat source) 20 mounted on the printed circuit board 40. Since it is difficult to place a reservoir tank 25 close to the CPU 20 on the printed circuit board 40, a connecting line 14 is used to connect the evaporator 10 and the reservoir tank 25.

Figure 2B:
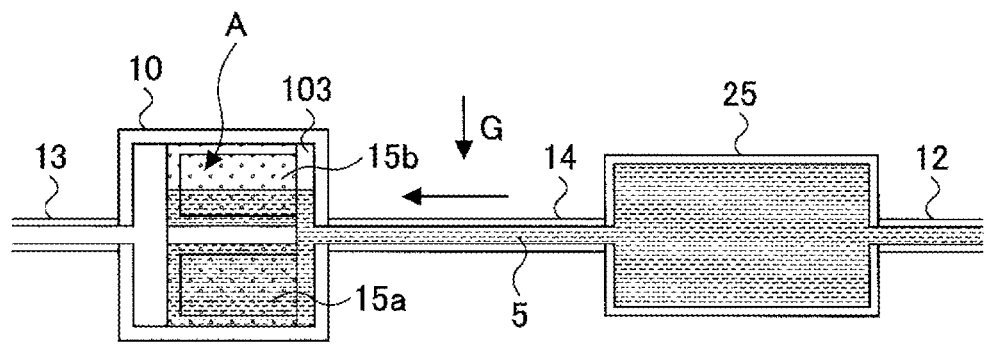
FIG. 2B illustrates problems assumed to arise from vapor bubbles in the vertically arranged loop heat pipe.

With the configuration of FIG. 2B in which a typical loop heat pipe is simply set up in the vertical orientation, wicks 15a and 15b arranged inside the evaporator 10 may cause another problem. Multiple wicks 15a and 15b are provided in the flat-plate evaporator 10 for the purpose of increasing the evaporating area. When the amount of heat generated from the CPU 20 increases, vapor (or bubbles) 103 due to heat leakage are produced not only at the evaporation surfaces of the wicks 15a and 15b (which are in contact with the inner walls of the evaporator 10), but also on the liquid side of the evaporator 10. In this case, the vapor bubbles 103 have no place to escape and stay inside the upper wick 15b (as illustrated by the arrow A).

Figure 2C:
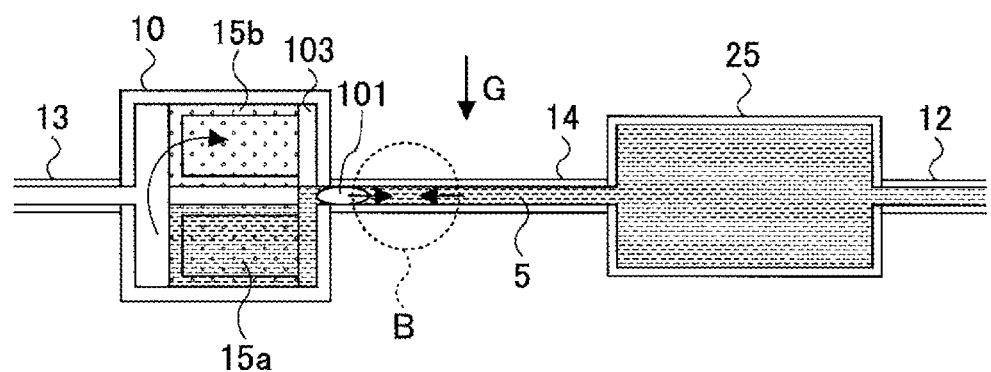
FIG. 2C illustrates problems assumed to arise from vapor bubbles in the vertically arranged loop heat pipe.

If the vapor bubbles 103 are further accumulated in the upper wick 15b, a working liquid 5 cannot flow into the upper space of the evaporator 10, and the upper wick 15b is likely to dry out, as illustrated in FIG. 2C. In addition, vapor bubbles 101 accumulated in the evaporator 10 are apt to move back through the connecting line 14. This phenomenon also prevents the working liquid from flowing into the evaporator 10.

With a cylindrical evaporator, bubbles can be discharged to a reservoir tank without preventing the flow of the working liquid 5 by placing a cylindrical reservoir tank near the evaporator and connecting the evaporator and the reservoir tank with a large-diameter connecting line. However, with a thin flat-plate evaporator, a large-diameter connecting line cannot be used to connect the evaporator and the reservoir tank 25. Besides, if the evaporator 10 and the reservoir tank 25 are arranged separately as in FIG. 2A, layout of the connecting line 14 is further limited and removal of the vapor bubbles 101 clogging the connecting line 14 becomes difficult.

Figure 3:
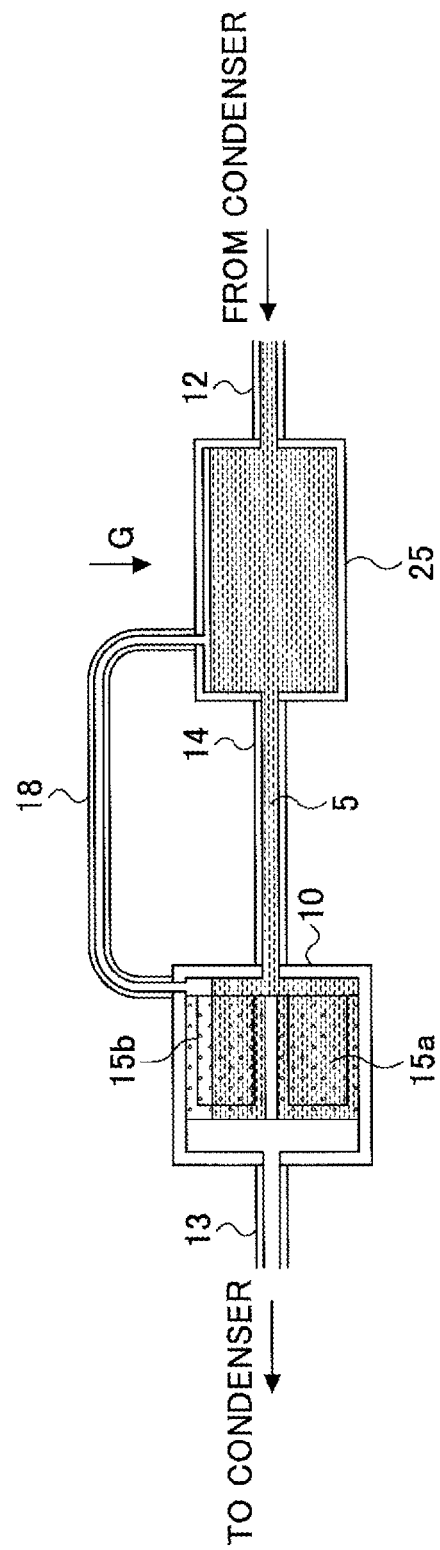
FIG. 3 illustrates a structure of the major part of a loop heat pipe according to Embodiment 1.
Figure 4A:
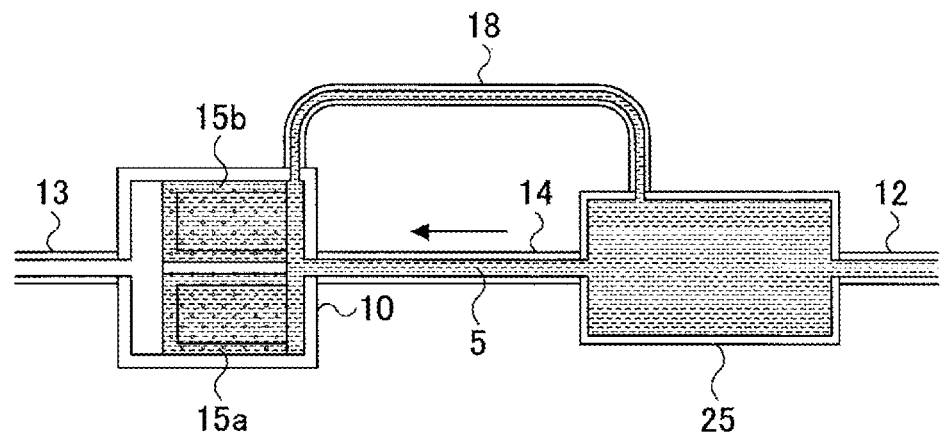
FIG. 4A is a diagram explaining operations of the loop heat pipe of Embodiment 1.
Figure 4B:
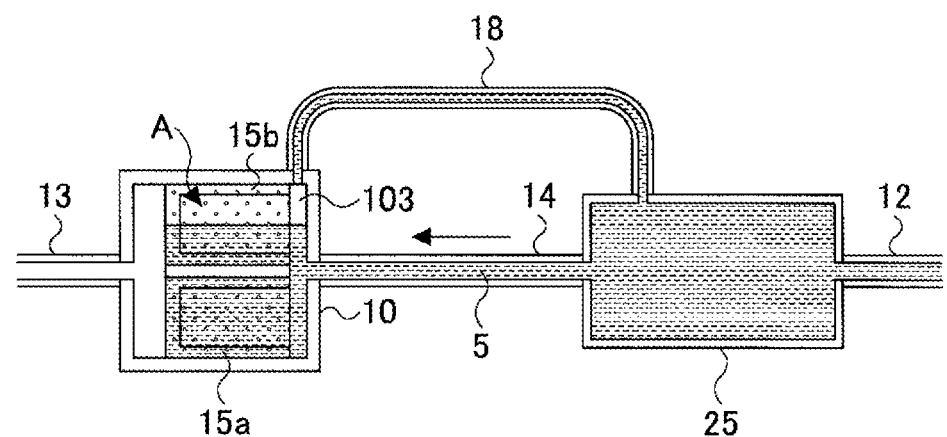
FIG. 4B is a diagram explaining operations of the loop heat pipe of Embodiment 1.
Figure 4C:
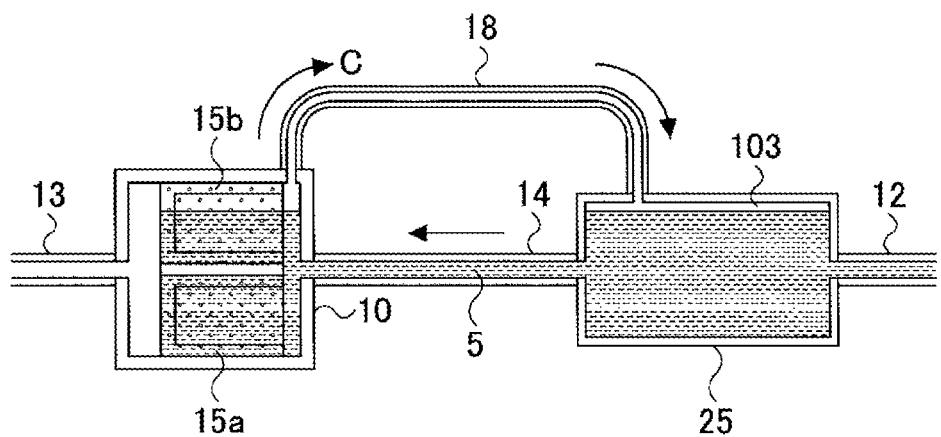
FIG. 4C is a diagram explaining operations of the loop heat pipe of Embodiment 1.
Figure 5:
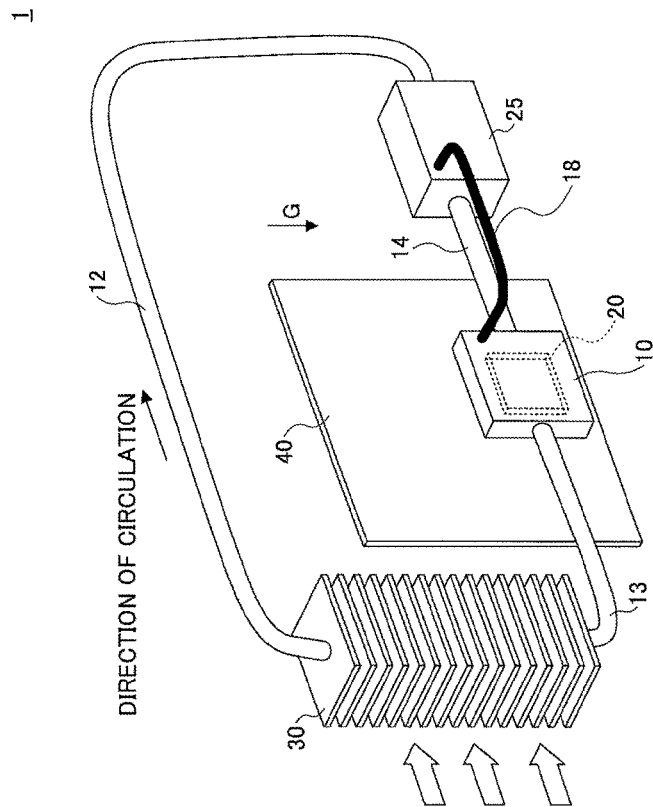
FIG. 5 illustrates an overall structure of a vertically arranged loop heat pipe according to Embodiment 1.

Thus, problems of excessive quantity of vapor due to heat leakage become more serious when the loop heat pipe is arranged in the vertical orientation, or when the evaporator and the reservoir tank are arranged separately. To solve the technical problems of vapor clogging, Embodiment 1 proposes to employ the structures illustrated in FIG. 3 through FIG. 5. FIG. 3 is a schematic cross-sectional view illustrating the major part of the loop heat pipe of Embodiment 1. FIG. 4A, FIG. 4B and FIG. 4C illustrate operations of the major part of FIG. 3. FIG. 5 illustrates an overall structure of the loop heat pipe to which the structure of FIG. 3 is applied.

A loop heat pipe 1 (illustrated in FIG. 5) includes the evaporator 10 that vaporizes the working fluid 5 with heat transported from the heat source 20, and a condenser 30 that condenses the vaporized working fluid 5. The evaporator 10 and the condenser 30 are connected in a loop with a liquid line 12 and a vapor line 13. The reservoir tank 25 is provided on the liquid line 12 for supplying the liquid-phase working fluid (i.e., the working liquid) condensed at the condenser 30 to the evaporator 10. The working liquid 5 is supplied from the reservoir tank 25 to the evaporator 10 through the connecting line 14. The evaporator 10 is a flat-plate evaporator, and the evaporator 10 is arranged in the vertical orientation to cool the CPU 20 mounted on the vertically arranged printed circuit board 40.

In the loop heat pipe 1, a bypass line 18 for connecting the evaporator 10 and the reservoir tank 25 is provided over the connecting line 14 in the direction of gravity G. The bypass line 18 is used to discharge the vapor bubbles 103 accumulated in the evaporator 10 to the reservoir tank 25 during operations of the loop heat pipe 1. The bypass line 18 located over the connecting line 14 allows the high-temperature vapors bubbles 103 produced in the evaporator 10 to escape to the reservoir tank 25 located on the low-temperature side. This arrangement can maintain an appropriate flow of the working liquid 5 from the connecting line 14 to the evaporator 10 and prevent drying out of a part of the divided wicks 15a and 15b (for example, the upper wick 15b).

FIG. 4A through FIG. 4C illustrate operations of the vapor bubble discharge process using the bypass line 18. As illustrated in FIG. 4A, before vapor bubbles are produced, the rate of heat transferred from the CPU 20 (see FIG. 5) to the evaporator 10 has not reached the extent to directly evaporate the working liquid 5 supplied in the evaporator 10. In this state, the working liquid 5 penetrating through the wick 15 held in close contact to the inner wall of the evaporator 10 absorbs heat transferred from the CPU 20 via the inner wall of the evaporator 10 and vaporizes. The vapor is discharged through grooves (not illustrated in figures) to the vapor line 13. At this time, the working liquid 5 inside the bypass line 18 remains stationary or flows toward the evaporator 10.

Then, as illustrated in FIG. 4B, when the rate of heat transferred from the CPU 20 increases, the heat continues to evaporate the working liquid 5 penetrating through the wick 15 at the inner wall of the evaporator 10 and in addition, surplus heat escapes to the working liquid 5 that flows into to the evaporator 10 from the connecting line 14. This heat leakage causes high-temperature vapor bubbles 103 to be produced in the working liquid 5 at the inner space surrounded by the wick 15 in the evaporator 10. The high-temperature vapor bubbles 103 move toward the reservoir tank 25 located on the lower temperature side through the bypass line 18 which is provided over the connecting line 14 as illustrated in FIG. 4C. The vapor bubbles 103 discharged to the reservoir tank 25 are condensed at the liquid interface of the reservoir tank 25 and return to the liquid phase. In this process, the working liquid 5 keeps on flowing through the connecting line 14 toward the evaporator 10 without prevention. Because the vapor bubbles 103 accumulated in the evaporator 10 are discharged from the evaporator 10, degradation of the capillary force of the wick 15 due to the accumulated bubbles can be prevented. Even if the wick 15 is divided into two or more parts, penetration of the working liquid 5 into the upper wick 15b is secured and undesirable dryout is prevented.

The bypass line 18 is adopted to discharge the vapor or the vapor bubbles 103 from the evaporator 10 to guarantee a normal flow of the working liquid 5 from the connecting line 14 into the evaporator 10. Accordingly, it is desired that the diameter of the bypass line 18 is selected so as not to be space-consuming insofar as there is an appropriate formation of a vapor channel. It is also desired that the temperature of the vapor bubbles 103 produced in the evaporator 10 falls to a certain degree until they reach the reservoir tank 25. From these viewpoints, the inner diameter of the bypass line 18 is set smaller than the inner diameter of the connecting line 14.

In FIG. 3 through FIG. 5, resolution of vapor bubble clogging is explained using an example of a vertically arranged loop heat pipe 1. However, the same problems of vapor bubble clogging (such as degradation of the capillary force of the wick or back flow of vapor bubbles into the connecting line) will arise in a horizontal configuration in which a flat-plate evaporator is placed on a heat source (such as a CPU) in a horizontal plane, if the reservoir tank and the evaporator are connected via a narrow connecting tube. The above-noted problems of vapor bubble clogging can also be solved in the horizontal configuration by providing a bypass line 18 over the connecting line 14.

Figure 6A:
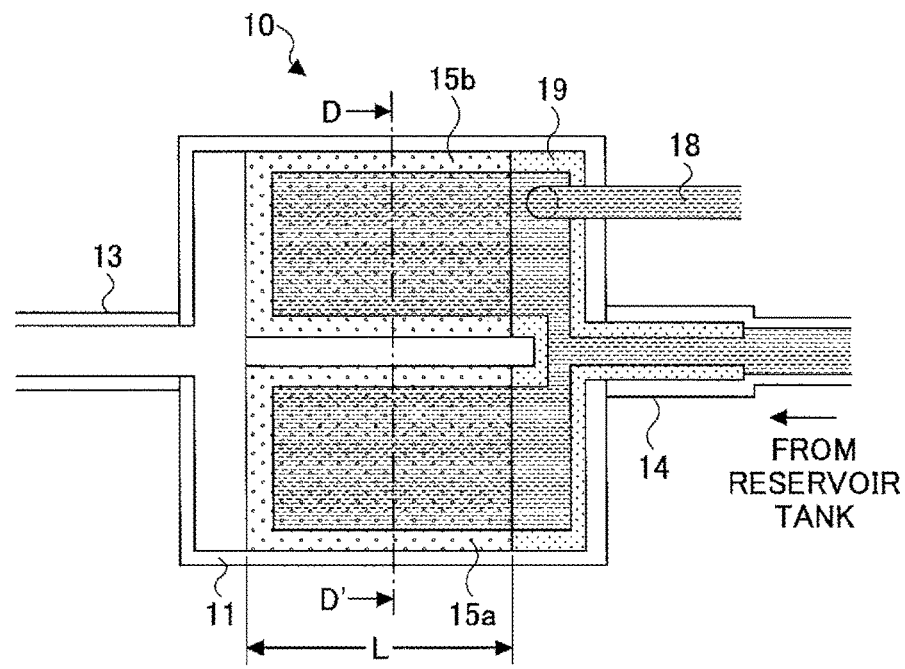
FIG. 6A is a cross-sectional view of the evaporator and tubes connected to the evaporator used in the loop heat pipe of FIG. 5, taken along the flowing direction of the working fluid.
Figure 6B:
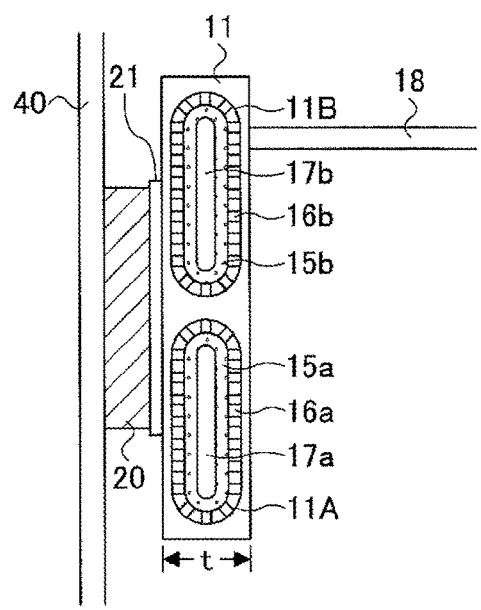
FIG. 6B is a cross-sectional view of the evaporator taken along the D-D' line of FIG. 6A, illustrating the inner structure of the evaporator.

Next, referring to FIG. 5, FIG. 6A and FIG. 6B, an actual example of the loop heat pipe 1 of Embodiment 1 is explained. FIG. 6A is a vertical cross-sectional view of the evaporator 10 taken along the flow direction of the working liquid 5, and FIG. 6B is a cross-sectional view of the evaporator 10 taken along the D-D' line of FIG. 6A, illustrating the inner structure of the evaporator 10. A main casing 11 of the evaporator 10 is made of an oxygen free copper. The main casing 11 is square-shaped, 40 mm on a side, with a thickness of 8 mm. Such a thin and compact shape is suitable for being mounted on the heat source (CPU) 20 used in a high-density computer such as a server or a personal computer.

Two holes 11A and 11B are formed side by side inside the main casing 11, each hole having an oval (or elliptical) cross-section. The long radius of each of the holes 11A and 11B is 18 mm, and the short radius is 6 mm. Resin wicks (porous wicks) 15a and 15b are inserted in the holes 11A and 11B, respectively. The sizes of the wicks 15a and 15b are made 100-200 μm greater than those of the holes 11A and 11B in both the long radius and the short radius. The length (L) of the wicks 15a and 15b along the flow direction is about 30 mm. The sizes of the wicks 15a and 15b are slightly greater than the holes 11A and 11B of the main casing 11. By forming the wicks 15a and 15 using a porous material such as PTFE (polytetrafluoroethylene), some elasticity (or flexibility) is given to the wicks 15a and 15b. When the wicks 15a and 15b are inserted in the holes 11A and 11B, they come into close contact to the inner walls of the main casing 11. The average porous diameter of the resin wicks 15a and 15b is about 2 μm and the porosity is about 40%. Each of the resin wicks 15a and 15b has a shape like an oval glass. Spaces 17a and 17b, each having an oval cross-section, are formed inside the resin wicks 15a and 15b. The shorter axis and the longer axis of the oval cross-section are 2 mm and 14 mm, respectively. The spaces 17a and 17b become flowing channels of the working liquid 5. The liquid-phase working fluid 5 flows into the evaporator 10 through a resin manifold 19 from the connecting line 14.

Grooves 16a and 16b are formed in the inner faces of the metallic main casing 11 against which the wicks 15a and 16b are pressed. Each of the grooves 16a and 16b includes multiple channels, each having dimensions of 1 mm depth×1 mm width. Vapor is produced at the surface of each channel and discharged from the evaporator 10 through the channels to the vapor line 13.

The resin manifold 19 is provided inside of the main casing 11 made of a metal such that there is no gap between the resin manifold 19 and the resin wicks 15a and 15b. The resin manifold 19 is made of, for example, MC nylon. The manifold 19 distributes the liquid-phase working fluid 5 flowing from the connecting line 14 to the resin wicks 15a and 15b without leakage from the manifold 19. Using the resin manifold 19, heat insulation effect for reducing the rate of heat transferred to the liquid-phase working fluid 5 flowing into the evaporator 10 is expected.

The reservoir tank 25 has dimensions of 20 mm height, 30 mm width (along the vertical direction), and 60 mm length. The reservoir tank 25 is formed in a box with a thickness of 1 mm and made of copper. The reservoir tank 25 is provided in the liquid line 12 at a 100 mm distance from the evaporator 10. The connecting line 14 connecting the evaporator 10 and the reservoir tank 25, the liquid line 12 connecting the reservoir tank 25 and the condenser, the vapor line 13, and the pipework of the condenser 30 are copper tubes with an outer diameter of 4 mm and an inner diameter of 3 mm.

The bypass line 18 is provided such that the liquid side (in which the manifold 19 is inserted) of the evaporator 10 is communicating with the reservoir tank 25. The bypass line 18 and the connecting line 14 are in a positional relationship such that the bypass line 18 is located over the connecting line 14 in the direction of gravity when the loop heat pipe 1 is attached to electronic equipment. The bypass line 18 is a narrow copper tube with an outer diameter of 2 mm and an inner diameter of 1 mm. These arrangements solve the technical problems of vapor bubble clogging. In addition, cooling effect by which the temperature of the high-temperature vapor discharged from the evaporator 10 may fall in the bypass line 18 on the way to the reservoir tank 25 is expected. Under the cooling effect, temperature rise of the working liquid 5 in the reservoir tank 25 can be prevented.

After assembling of the evaporator 10 and the reservoir tank 25, the vapor line 13, the condenser 30 with radiator fins, and the liquid line 12 are connected in a loop by welding, and a working fluid is introduced inside. The total length from the vapor line 13 through the condenser 30 and the liquid line 12 to the reservoir tank 25 is about 900 mm. In Embodiment 1, n-pentane is used as the working fluid 5, but water, ethanol, R141B, acetone, butane, ammonia, and etc., may be used as the working fluid.

The evaporator 10 may be secured to a heat source (CPU) 20 in electronic equipment via thermal grease (such as W4500 manufactured and sold by Cosmo Oil Lubricants Co., Ltd.) using a clamp (not illustrated) fastened by screws. In the example illustrated in FIG. 5, electronic equipment to which the loop heat pipe 1 is applied is a vertical tower PC and the printed circuit board 40 is arranged in vertical orientation in the housing rack (not illustrated).

To check the advantageous effects of Embodiment 1, the CPU 20 mounted on the printed circuit board 40 as illustrated in FIG. 5 is cooled by the loop heat pipe 1, and changes in the heat transfer resistance are measured. The maximum heat rate of the CPU 20 is 100 W. During the operation of the loop heat pipe 1, air is supplied to the radiator fins of the condenser 30 from a blast fan (not illustrated) to accelerate the cooling process. The hot air having passed through the radiator fins is exhausted directly from the housing rack by the blast fan. As a comparative example, a loop heat pipe of the same configuration as Embodiment 1 except that no bypass line 18 is provided between the evaporator 10 and the reservoir tank 25 is fabricated. The cooling capability of the comparison example is measured in the same manner.

Figure 7:
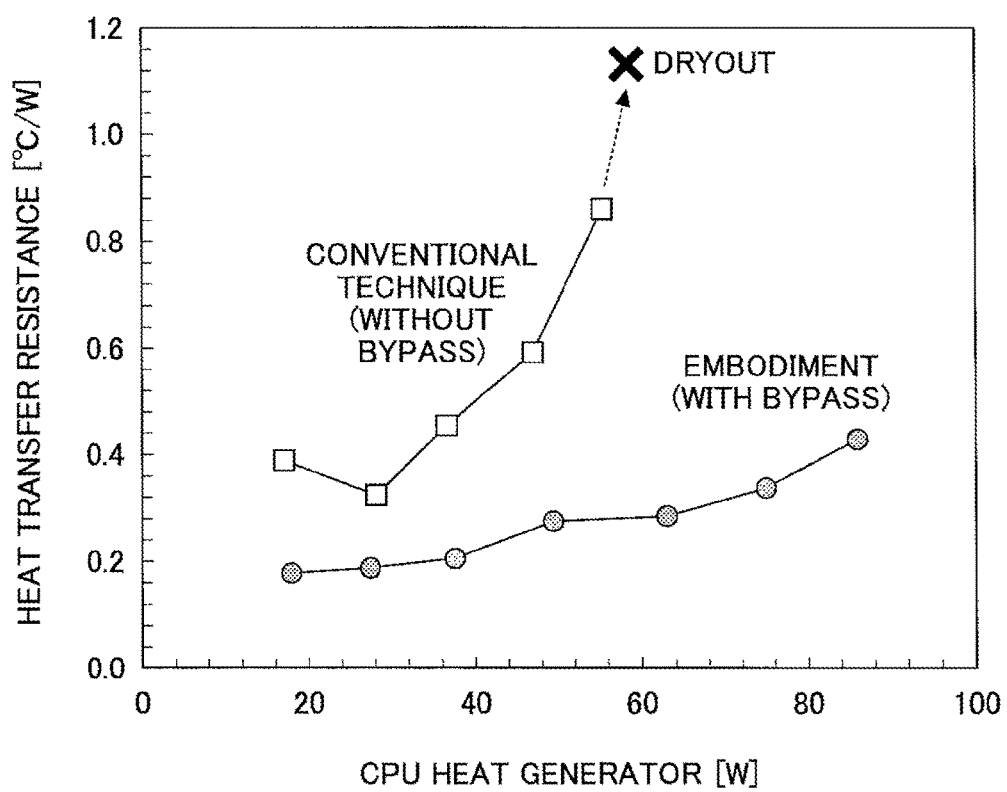
FIG. 7 is a diagram illustrating the advantageous effect of Embodiment 1.

FIG. 7 is a diagram illustrating the cooling capability of the loop heat pipe of Embodiment 1 in comparison with a conventional loop heat pipe. The horizontal axis of the graph represents heat rate [W] of the CPU 20, and the vertical axis represents heat transfer resistance [° C./W]. The heat transfer resistance is calculated by measuring the average temperatures of the evaporator 10 and the condenser 30, respectively, every time the heat rate of the CPU 20 changes at a certain step-size and dividing the temperature differences between the evaporator 10 and the condenser 30 by the corresponding heat rate. In the conventional loop heat pipe with no bypass line 18, the heat transfer resistance starts rising at the heat rate of 30 W. At heat rate of 58 W, the evaporator 10 is dried out and the temperature of the CPU 20 rises abruptly. In contrast, with the loop heat pipe 1 of Embodiment 1 with the bypass line 18, there is no rapid rise occurring in the heat transfer resistance until the heat rate of the CPU 20 becomes 90 W. From this experiment, it is confirmed that the loop heat pipe of Embodiment 1 can cool the CPU 20 in a stable manner.

By employing the structure of Embodiment 1, the loop heat pipe 1 operates properly, while maintaining high cooling performance, even if the flat-plate evaporator 10 is arranged in vertical orientation. Because the loop heat pipe 1 of Embodiment 1 can cool electronic equipment in a stable manner, stable operation of the electronic equipment can be assured. Besides, circulation of working fluid is maintained appropriately avoiding bubble clogging even if the evaporator 10 of the loop heat pipe 1 is made thin and compact. Accordingly, a high degree of design freedom is maintained even if the loop heat pipe 1 is applied to a high-density computer to cool high-heat-generating components mounted in it.

Figure 1A:
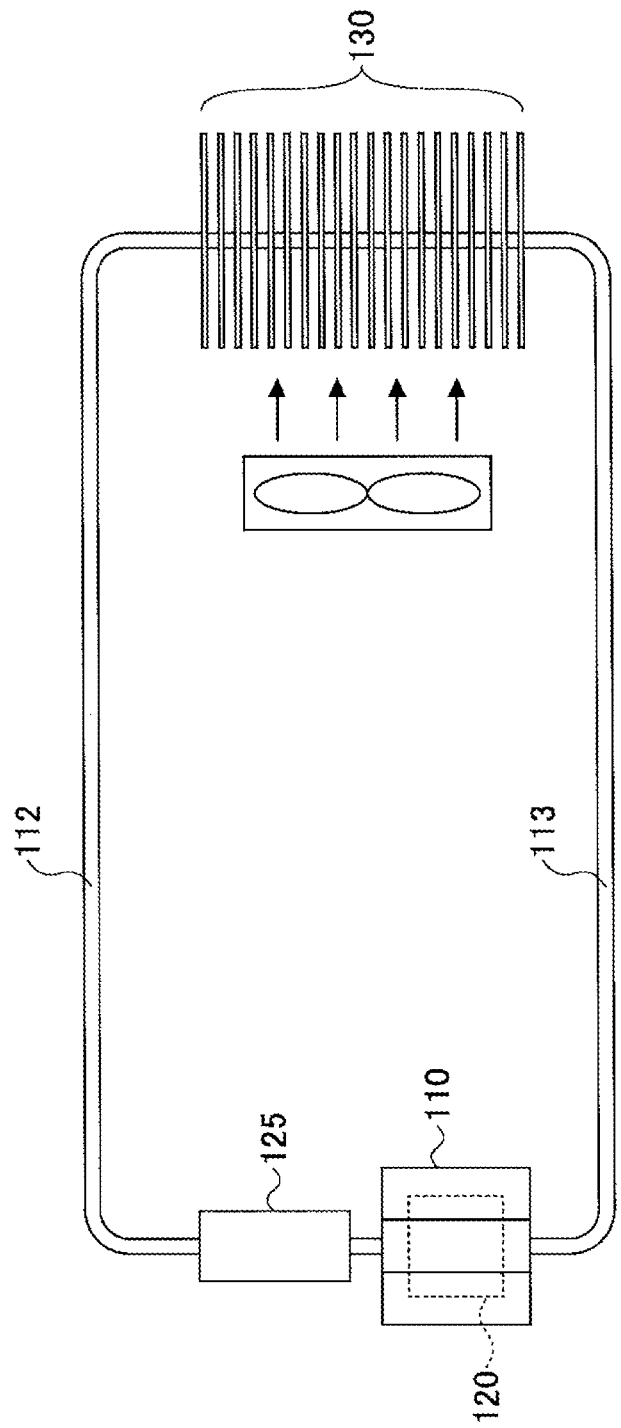
FIG. 1A is a schematic plan view illustrating an overall structure of a conventional loop heat pipe.
Figure 1B:
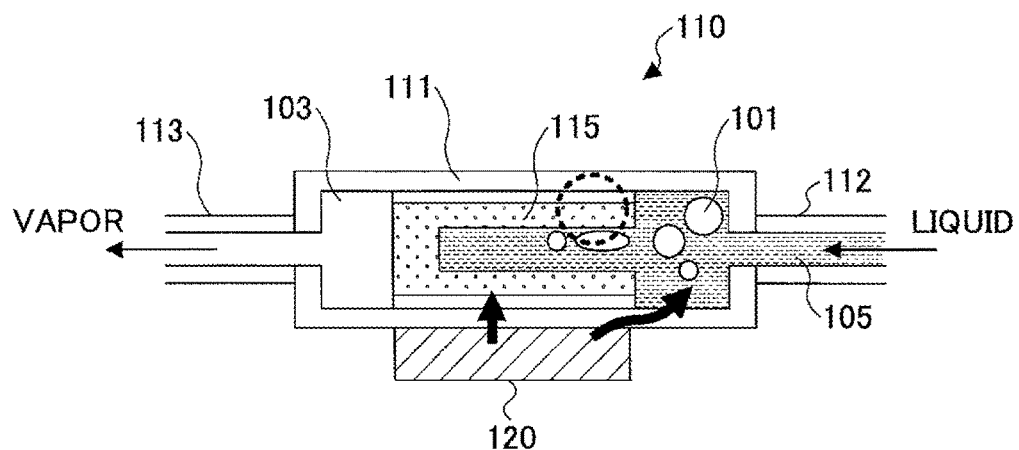
FIG. 1B illustrates a structure of an evaporator used in the loop heat pipe of FIG. 1A in a schematic cross-sectional view taken along a flow direction of a working fluid.
Figure 1C:
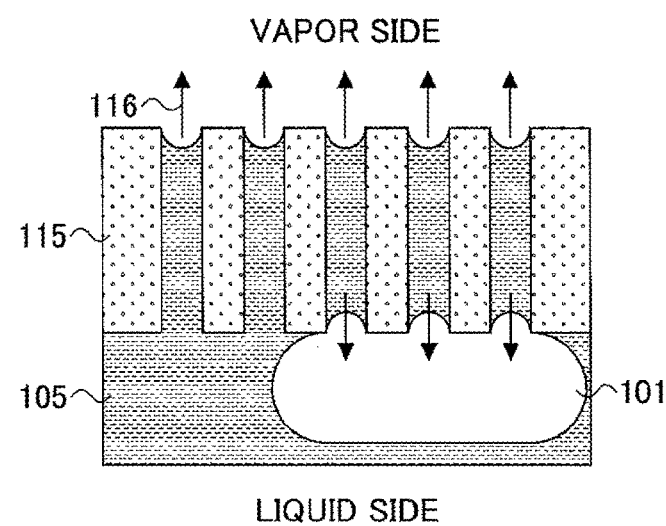
FIG. 1C is a schematic diagram illustrating problems of vapor bubbles arising in the conventional loop heat pipe.

Embodiment 1 has been described based upon an example of a vertical configuration in which the contact plane between the flat-plate evaporator and the heat source is parallel to the direction of gravity G. However, the loop heat pipe of Embodiment 1 is applicable to a horizontal configuration of FIG. 1B in which flat-plate evaporator is placed on the heat source mounted in a horizontal plane. In the horizontal configuration, a bypass line is provided over the connecting line along the direction of gravity, where the working liquid is supplied from the reservoir tank via the connecting line to the evaporator and vapor bubbles produced in the evaporator are discharged via the bypass line to the reservoir tank. With this arrangement, vapor bubble clogging and degradation of the capillary force can be prevented in the horizontally arranged evaporator.

In Embodiment 1, the cooling process is accelerated by sending the air to the radiator fins of the condenser 30. The condenser 30 may be cooled by immersing the condenser 30 in a liquid cooled below the room temperature. The material of the bypass line is not limited to copper, and other materials with high thermal conductivity, such as copper alloys, aluminum, or aluminum alloys, may be used.

<Embodiment 2>

Figure 8A:
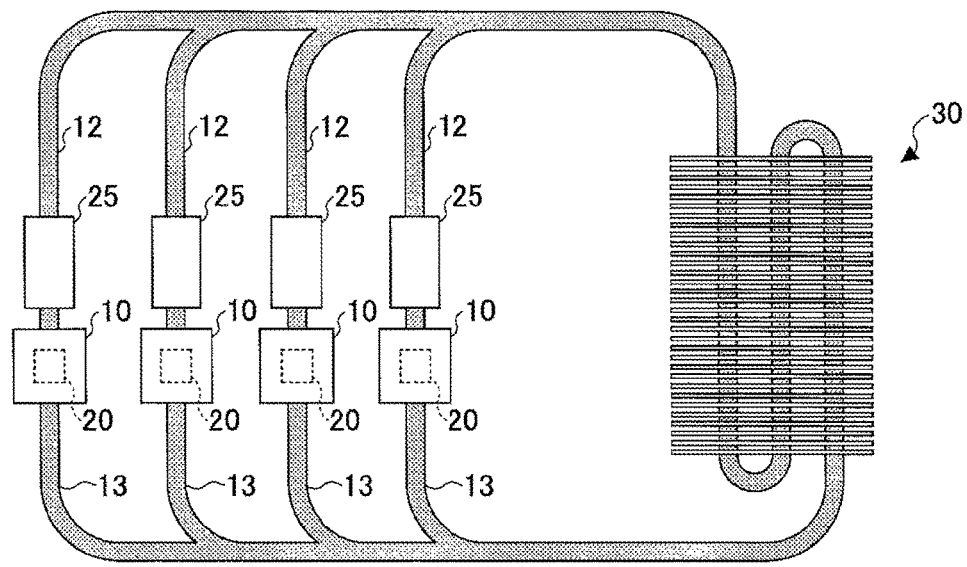
FIG. 8A illustrates a structure conceived during a process leading to the structure of Embodiment 2.

Next, a loop heat pipe according to Embodiment 2 is explained. In Embodiment 2, the loop heat pipe is applied to a multi-CPU board. It is a technology trend that multiple CPUs are used in a large scale computer to improve the performances. To cool multiple electronic components using a loop heat pipe, a structure illustrated in FIG. 8A may be conceived. In FIG. 8A, as many evaporators 10 as the number of electronic components 20 are used and reservoir tanks 25 are provided corresponding to the respective evaporators 10. However, if many reservoir tanks 25 are placed in the vicinity of the heat sources in one-to-one correspondence, the freedom in design is significantly limited. In particular, when devices are cooled in electronic equipment for which compact and dense layout is required, a space for placing the reservoir tanks 25 becomes a bottleneck. In general, an electronic component with the greatest amount of heat generation in a computer is a CPU. In order to avoid delays of electric signals and keep function and performance high, high-density packaging is demanded for the surroundings of a CPU.

Figure 8B:
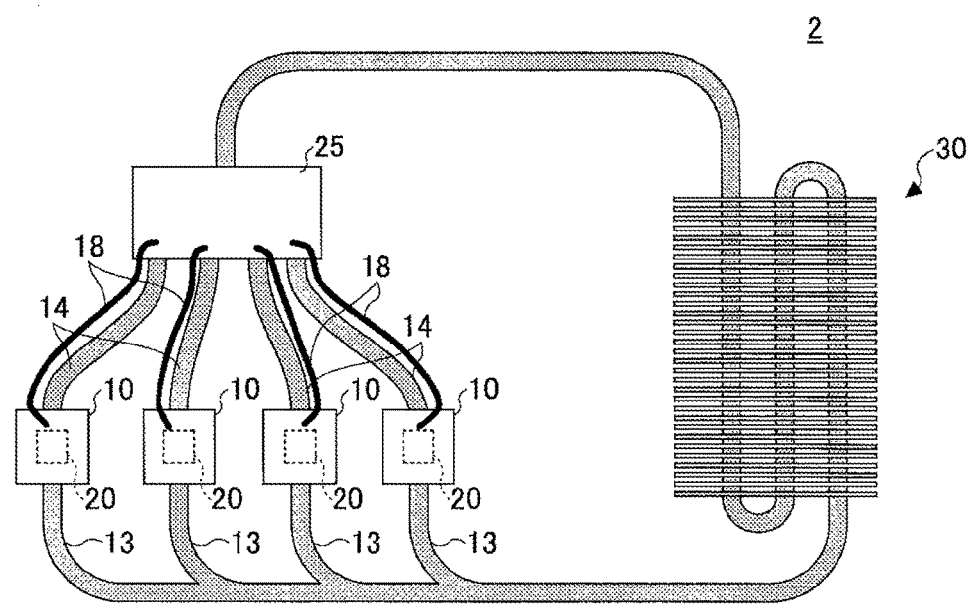
FIG. 8B illustrates an overall structure of a loop heat pipe according to Embodiment 2.

Accordingly, a loop heat pipe 2 illustrated in FIG. 8B uses a common reservoir tank 25 which is placed separately from the heat sources such as CPUs. Multiple connecting lines 14 are provided between the common reservoir tank 25 and evaporators 10 to supply working liquid. If a conventional loop heat pipe is extended as it is to a multiprocessor configuration, the evaporators 10 and the separately positioned reservoir tank 25 are connected via small-diameter connecting lines 14 in relation to the layout in the electronic equipment. In this case, the problem that the cooling ability is degraded due to vapor bubbles becomes conspicuous. Due to the vapor bubbles produced in the evaporator 10, the working liquid supplied from the reservoir tank 25 cannot flow smoothly into the evaporator 10, and the wick is dried out. To solve this problem, in Embodiment 2, the respective evaporators 10 are connected to a common reservoir tank 25 via connecting lines 14, and bypass lines 18 are provided over the connecting lines 14 along the direction of gravity. Vapor bubbles are discharged from each of the evaporators 10 to the reservoir tank 25. This arrangement can resolve the vapor bubble clogging at each evaporator 10 and allows the working liquid to flow into the evaporators 10 appropriately.

Figure 9:
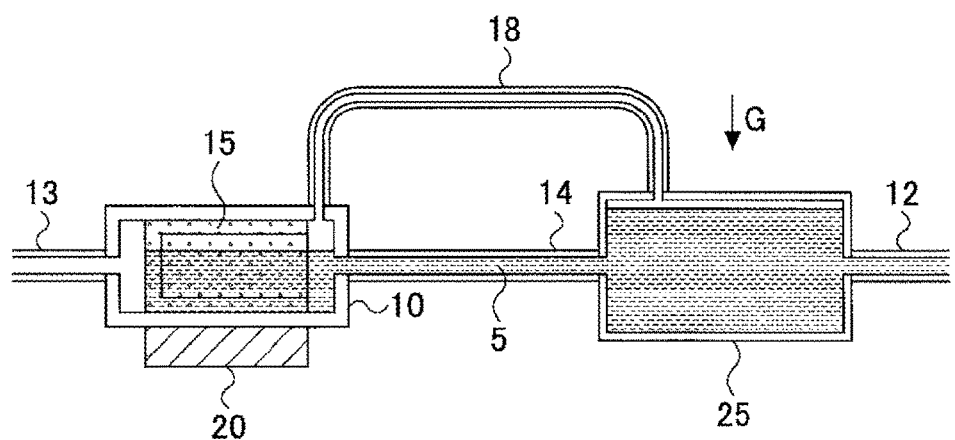
FIG. 9 illustrates a structure of the major part of the loop heat pipe according to Embodiment 2.

FIG. 9 illustrates a major part of the loop heat pipe 2 of Embodiment 2. Only one of the evaporators 10 connected to the reservoir tank 25 is illustrated in FIG. 9. The evaporator 10 is provided onto a top surface of the heat source 20 such as a CPU or the like which is placed in a horizontal plane extending in a direction perpendicular to the direction of gravity. The bottom face of the evaporator 10 is a contact surface to the CPU 20. The bypass line 18 is positioned over the connecting line 14 along the direction of gravity G. The bypass line 18 is connected to, for example, the top surface of the evaporator 10, which surface is opposite to the contact surface between the evaporator 10 and the CPU 20. As in Embodiment 1, the inner diameter of the bypass line 18 is set smaller than that of the connecting line 14 such that the temperature of the high-temperature vapor falls to a certain extent before it reaches the reservoir tank 25.

Figure 10A:
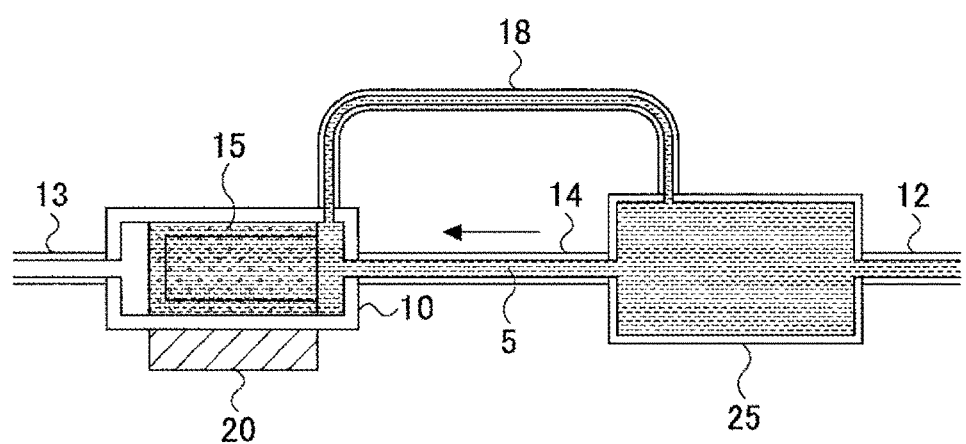
FIG. 10A is a diagram explaining operations of the loop heat pipe of Embodiment 2.
Figure 10B:
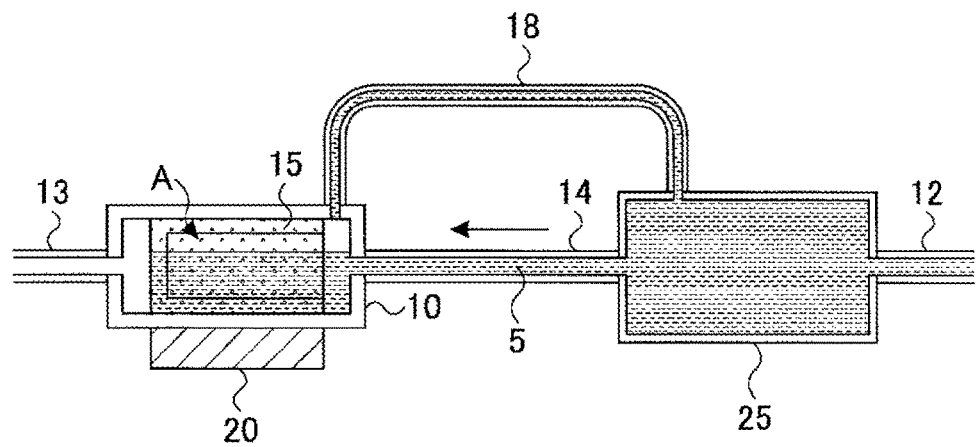
FIG. 10B is a diagram explaining operations of the loop heat pipe of Embodiment 2.
Figure 10C:
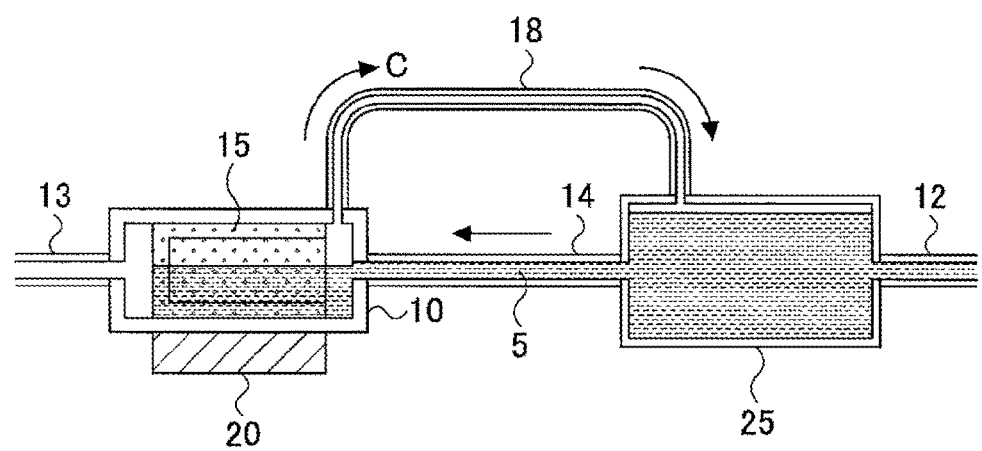
FIG. 10C is a diagram explaining operations of the loop heat pipe of Embodiment 2.

FIG. 10A through FIG. 10C illustrate how the vapor bubbles are discharged to the reservoir tank 25 during operations of the loop heat pipe 2. In FIG. 10A, heat transferred from the CPU 20 to the evaporator 10 has not reached a level to directly boil the working liquid 5 supplied into the evaporator 10, and vapor bubbles have not been produced yet. In this state, the working liquid 5 penetrating through the wick 15 which is brought to close contact with the inner wall of the evaporator 10 absorbs the heat from the CPU 20 and vaporizes. The vapor is discharged through grooves (not illustrated) to the vapor line 13. At this time, the working liquid 5 inside the bypass line 18 is stationary or flows toward the evaporator 10.

Then, as illustrated in FIG. 10B, when the rate of heat generated from the CPU 20 increases, the heat continues to evaporate the working liquid 5 penetrating through the wick 15 at the inner wall of the evaporator 10 and in addition, surplus heat escapes to the working liquid 5 that flows into to the evaporator 10 from the connecting line 14. This heat leakage causes high-temperature vapor bubbles 103 to be produced in the working liquid 5 at the inner space surrounded by the wick 15 in the evaporator 10.

Then, as illustrated in FIG. 10C, the high-temperature vapor bubbles move toward the reservoir tank 25 located on the lower temperature side through the bypass line 18. The vapor bubbles discharged to the reservoir tank 25 are condensed at the liquid interface of the reservoir tank 25 and return to the liquid phase. In this process, the working liquid 5 keeps on flowing through the connecting line 14 toward the evaporator 10 without interruption. Degradation of the capillary force of the wick 15 due to the accumulated bubbles can also be prevented.

Figure 11:
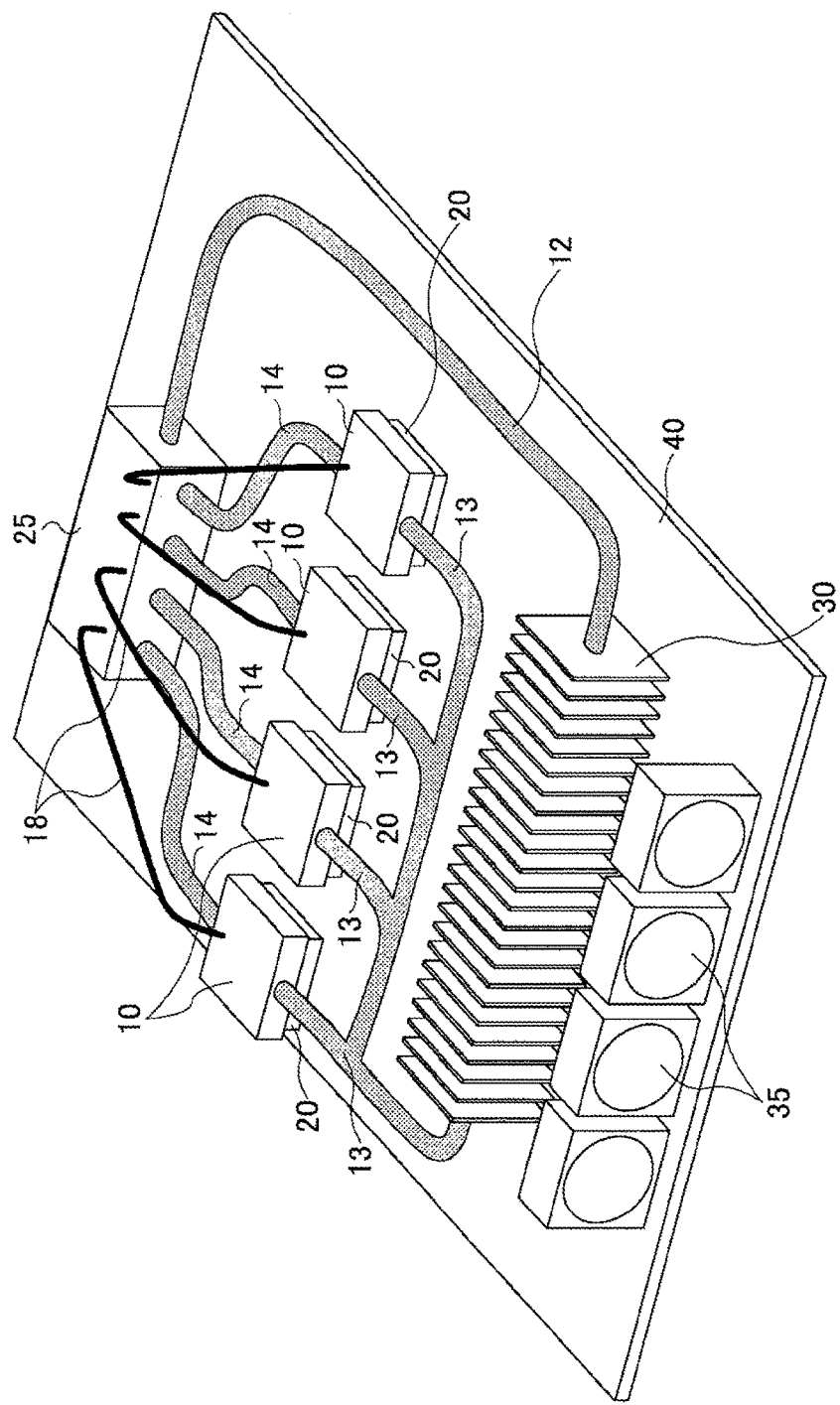
FIG. 11 is a perspective view illustrating an overall structure of the loop heat pipe of Embodiment 2.

FIG. 11 illustrates an overall structure of the loop heat pipe 2 of Embodiment 2. A computer to be cooled is a rack-mount server laid flat on a plane, and a printed circuit board 40 is placed horizontally inside of a housing rack (not illustrated). Four CPUs 20 (maximum heat rate per CPU is 100 W) mounted on the printed circuit board 40 are cooled using the loop heat pipe 2 of Embodiment 2.

Each of the evaporators 10 is brought into contact with one of the CPUs 20 to cool the corresponding CPU 20. In this example of FIG. 11, two or more evaporators 10 are connected in parallel in the circulating system. The vapor outlets of the evaporators 10 are connected to copper vapor lines (with an outer diameter of 6 mm and an inner diameter of 5 mm), collected into a single line and connected to the inlet of the condenser 30. The condenser 30 has aluminum fins (arranged at a pitch of 1.5 mm and each having a thickness of 0.1 mm) which are caulked to a copper condenser tube. An outlet of the condenser 30 is connected to the reservoir tank 25 via a copper liquid line (with an outer diameter of 3 mm and an inner diameter of 2 mm). The reservoir tank 25 is connected to each of the evaporators 10 via a connecting line 14 for supplying the working liquid to the evaporator, and in communicating with each of the evaporator 10 via a bypass line 18 for discharging vapors from the evaporator 10. The internal structure of each of the evaporators 10 is the same as that explained in Embodiment 1 with reference to FIG. 6A and FIG. 6B and explanation for them is omitted.

The reservoir tank 25 is a box made of steel use stainless (SUS) with dimensions of 25 mm height, 120 mm width, and 50 mm length and has a thickness of 0.5 mm. The reservoir tank 25 and each of the four evaporators 10 are connected by the connecting line 14 of 100-150 mm length (with an outer diameter of 5 mm and an inner diameter of 4 mm) and the bypass line 18. The bypass lines 18 are provided such that the reservoir tank 25 communicates with the liquid side (the working liquid inlet side) of each of the evaporators 10. The relative position relationship between the bypass lines 18 and the connecting lines 14 is that the bypass lines 18 are located over the connecting lines 14 along the direction of gravity when the loop heat pipe 2 is assembled onto the electronic equipment as in Embodiment 1. The bypass lines 18 are not limited to copper narrow tubes with an outer diameter of 2 mm and an inner diameter of 1 mm.

Other materials such as copper alloys, aluminum and an aluminum alloy may be used. With this arrangement, a cooling effect that the temperature of the high-temperature vapor may fall in the bypass line 18 on the way to the reservoir tank 25 is expected. Under the cooling effect, temperature rise of the working liquid 5 in the reservoir tank 25 can be prevented.

After assembling of the evaporator 10 and the reservoir tank 25, the vapor line 13, the condenser 30 with radiator fins, and the liquid line 12 are connected in a loop by welding, and a working fluid is introduced inside. The total length from the vapor line 12 through the condenser 30 and the liquid line 12 to the reservoir tank 25 is about 900 mm. In Embodiment 2, n-pentane is used as the working fluid 5, but water, ethanol, R141B, acetone, butane, ammonia and etc. may be used as the working fluid.

Each of the evaporators 10 may be secured to the corresponding CPU 20 via thermal grease (such as W4500 manufactured and sold by Cosmo Oil Lubricants Co., Ltd.) using a clamp fastened by screws with springs. The condenser 30 of the loop heat pipe 2 may be cooled by sending the air from blast fans 35 to the radiation fins of the condenser 30. The hot air having passed through the radiator fins is exhausted directly from the housing rack by the blast fans 35. The condenser 30 may be cooled by immersing the condenser 30 in a liquid cooled below the room temperature.

To check the cooling effect of the loop heat pipe 2 manufactured by the above-described method, the loop heat pipe 2 is placed in the rack mount server to be cooled, and the internal temperature of each CPU 20 is measured. As a comparative example, a loop heat pipe of the same configuration as Embodiment 2 except that no bypass line 18 is provided between each of the evaporator 10 and the reservoir tank 25 is fabricated. The similar measurement is made in the comparison example.

Figure 12:
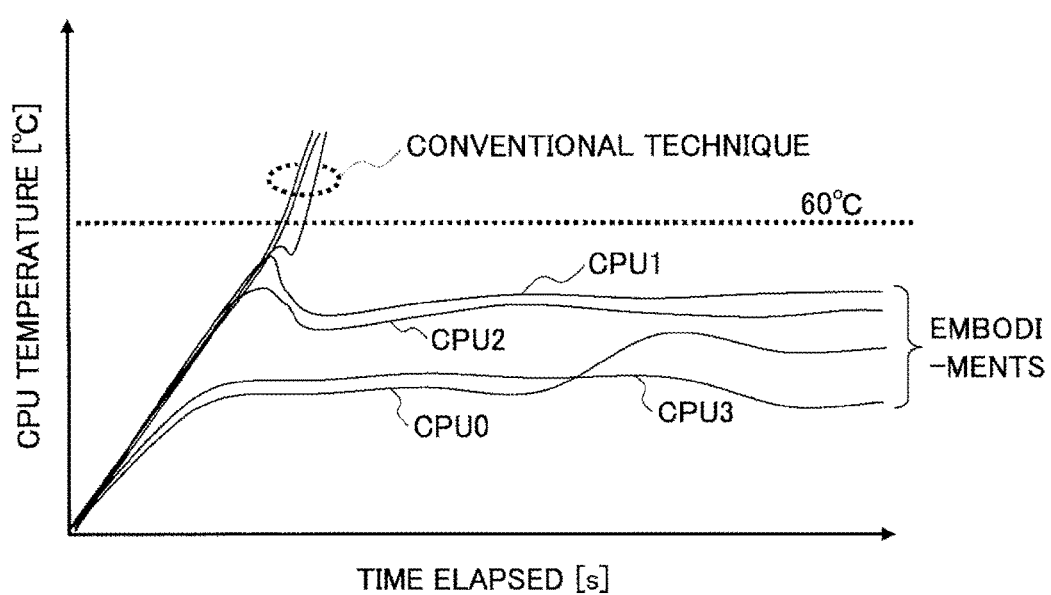
FIG. 12 is a diagram illustrating the advantageous effect of Embodiment 2.

FIG. 12 is a diagram illustrating the cooling effect of the loop heat pipe 2 of Embodiment 2. The server is activated, the loop heat pipe 2 is operated, and the temperatures of the four CPUs are measured as a function of time. As a comparative example, a loop heat pipe without bypass lines 18 is also measured. With the conventional loop heat pipe, circulation of the working fluid did not begin and the temperatures of all the four CPUs were rising beyond 60° C. Accordingly, the experiment using the conventional model was stopped. In contrast, with the loop heat pipe 2 of Embodiment 2, the four CPUs continue to operate at stable temperatures without abnormal temperature rise. This means that the working fluid 5 is constantly circulating in the loop heat pipe 2. The temperatures of the four CPUs are different because these CPUs operate in different operating conditions. However, all the CPUs operate stably at roughly constant temperatures.

By employing the structure of Embodiment 2, normal operations of the loop heat pipe 2 are maintained even if the reservoir tank is placed separately from the evaporators 10. Because the reservoir tank 25 is positioned away from the respective evaporators 10, the layout and design of the print circuit board in the electronic equipment is facilitated and the performance of the electronic equipment is improved. Multiple heat sources can be cooled simultaneously without causing vapor clogging. Thus, the loop heat pipe 2 of Embodiment 2 is suitably used to cool multi-CPU computer systems.

Although Embodiment 2 has been described based upon the example of horizontally arranged CPUs, the loop heat pipe 2 of Embodiment 2 is applicable to a vertical configuration in Embodiment 1. In the latter case, each of the evaporators 10 is positioned at a similar height to or a lower position than the reservoir tank 25. The bypass line connecting the reservoir tank 25 and each of the evaporators 10 is provided at a higher position than the reservoir tank 25. The loop heat pipe 2 can also be applicable to a multiprocessor cooling system using cylindrical evaporators. In this case, each of the cylindrical evaporators is connected to a common reservoir tank placed away from the cylindrical evaporators. Even if a small-diameter connecting line is used between the cylindrical evaporator and the reservoir tank from the viewpoint of the packaging density and the layout, the problem of vapor bubble clogging can be avoided effectively.

By placing the printed circuit board on which multiple CPUs are mounted in a housing rack and assembling the loop heat pipe 2 as illustrated in FIG. 11, electronic equipment with a horizontal configuration such as a flat-type rack-mount server is provided. Although not illustrated, a porous wick divided into two or more parts may be arranged with the parts parallel to each other in each of the evaporators 10 of the multi-CPU loop heat pipe of FIG. 11.

The loop heat pipe of the embodiments is applicable to cooling various heat sources such as electronic equipment and devices. vapor bubbles produced by heat leakage are discharged from the evaporator via the bypass line to the reservoir tank, and the working liquid can be introduced efficiently into the evaporator. Consequently, the cooling performance of the loop heat pipe is stabilized and improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

What is claimed is:

1. A loop heat pipe comprising:
an evaporator to cause a liquid-phase working fluid to be vaporized by heat from a heat source;
a condenser to condense the vaporized working fluid; a circulation path including a liquid line and a vapor line to connect the condenser and the evaporator in a loop;
a tank provided on the liquid line and configured to accommodate the liquid-phase working fluid;
a connecting line to connect the tank and the evaporator to supply the liquid-phase working fluid to the evaporator; and
a bypass line positioned over the connecting line in a direction of gravity and connecting the evaporator and the tank to discharge a vapor bubble produced in the evaporator during operation of the loop heat pipe to the tank,
wherein a porous wick divided into two or more parts is provided inside the evaporator, one part provided on a upper side and another part provided on a lower side of the evaporator along the direction of gravity, and the bypass line positioned over the connecting line in the direction of gravity extends from a vicinity of said one part of the porous wick provided on the upper side of the evaporator to the tank so as to be continuously in fluid communication with the tank.

2. The loop heat pipe according to claim 1, wherein the evaporator is of a flat plate type having a contact face that comes into contact with the heat source, and the evaporator is arranged such that the contact face is parallel to the direction of gravity.

3. The loop heat pipe according to claim 1, wherein an inner diameter of the bypass line is smaller than an inner diameter of the connecting line.

4. The loop heat pipe according to claim 1, wherein the bypass line is made of copper, a copper alloy, aluminum, or an aluminum alloy.

5. The loop heat pipe according to claim 1, wherein two or more of the evaporators are arranged, each of the evaporators being connected to the tank via a corresponding one of the connecting lines and a corresponding one of the bypass lines positioned over the connecting lines.

6. The loop heat pipe according to claim 5, wherein an inner diameter of each of the bypass lines is smaller than an inner diameter of the corresponding one of the connecting lines provided to the respective evaporators.

7. The loop heat pipe according to claim 5, wherein a contact face of each of the evaporators that comes into contact with the heat source is parallel to the direction of gravity.

8. The loop heat pipe according to claim 5, wherein the porous wick divided into two or more parts is provided inside each of the evaporators, the divided parts of the wick being parallel to each other in the direction of gravity.

9. The loop heat pipe according to claim 1, wherein the working fluid is selected from a group of pentane, butane, ammonium, water, ethanol, and acetone.

10. An electronic equipment comprising:
a substrate arranged in a direction of gravity; an electronic component mounted on the substrate; and a loop heat pipe to cool the electronic component; wherein the loop heat pipe includes
an evaporator having a contact face brought into contact with the electronic component, the contact face being parallel to the direction of gravity;
a tank connected to the evaporator via a connecting line and configured to supply a liquid-phase working fluid to the evaporator via the connecting line; and a bypass line positioned over the connecting line in the direction of gravity and connecting the evaporator and the tank to discharge a vapor bubble produced in the evaporator during operation of the loop heat pipe to the tank,
wherein a porous wick divided into two or more parts is provided inside the evaporator, one part provided on a upper side and another part provided on a lower side of the evaporator along the direction of gravity, and the bypass line positioned over the connecting line in the direction of gravity extends from a vicinity of said one part of the porous wick provided on the upper side of the evaporator to the tank so as to be continuously in fluid communication with the tank.

11. An electronic equipment comprising:
a substrate on which two or more electronic components are mounted; and a loop heat pipe to cool said two or more electronic components; wherein the loop heat pipe includes
two or more evaporators, each of the evaporators being provided to a corresponding one of the electronic components;
a common tank connected to each of the evaporators via a corresponding connecting line and configured to supply a liquid-phase working fluid to said each of the evaporators; and
two or more bypass lines to connect the common tank and said two or more evaporators, each of the bypass lines being positioned over a corresponding one of the connecting lines in the direction of gravity and connecting the tank and the corresponding evaporator to discharge a vapor bubble produced in the evaporator during operation of the loop heat pipe to the tank,
wherein a porous wick divided into two or more parts is provided inside each of the evaporators, one part provided on a upper side and another part provided on a lower side of associated one of the evaporators along the direction of gravity, and each of the bypass lines positioned over the corresponding one of the connecting lines in the direction of gravity extends from a vicinity of said one part of the porous wick provided on the upper side of the associated evaporator to the tank so as to be continuously in fluid communication with the tank.

12. The loop heat pipe according to claim 1, wherein said other part of the porous wick provided on the lower side of the evaporator is positioned below the connecting line that supplies the liquid-phase working fluid to the evaporator.

13. The electronic equipment according to claim 10, wherein said other part of the porous wick provided on the lower side of the evaporator is positioned below the connecting line that supplies the liquid-phase working fluid to the evaporator.

14. The electronic equipment according to claim 11, wherein said other part of the porous wick provided on the lower side of the evaporator is positioned below an associated one of the connecting lines that supplies the liquid-phase working fluid to the evaporator.

* * * * *